United States Patent
Chang

(10) Patent No.: US 7,973,572 B2
(45) Date of Patent: Jul. 5, 2011

(54) OUTPUT BUFFER AND SOURCE DRIVER UTILIZING THE SAME

(75) Inventor: Yu-Jui Chang, Tainan County (TW)

(73) Assignee: Himax Technologies Limited, Sinshih Township, Tainan County (TW)

( * ) Notice: Subject to any disclaimer, the term of this patent is extended or adjusted under 35 U.S.C. 154(b) by 0 days.

(21) Appl. No.: 12/354,993

(22) Filed: Jan. 16, 2009

(65) Prior Publication Data

US 2010/0182070 A1     Jul. 22, 2010

(51) Int. Cl.
*H03K 3/00*     (2006.01)
(52) U.S. Cl. ......................................... 327/108
(58) Field of Classification Search .................. None
See application file for complete search history.

(56) References Cited

U.S. PATENT DOCUMENTS

| | | | | |
|---|---|---|---|---|
| 5,920,210 A | * | 7/1999 | Kaplinsky | 327/112 |
| 5,929,668 A | * | 7/1999 | Kim | 327/112 |
| 6,137,322 A | * | 10/2000 | Ten Eyck | 327/112 |
| 6,483,340 B2 | * | 11/2002 | Uenishi | 326/27 |
| 7,236,004 B1 | * | 6/2007 | Zhou et al. | 326/33 |
| 2007/0262941 A1 | * | 11/2007 | Jan et al. | 345/96 |

* cited by examiner

*Primary Examiner* — Lincoln Donovan
*Assistant Examiner* — Khareem E Almo
(74) *Attorney, Agent, or Firm* — Thomas | Kayden

(57) ABSTRACT

An output buffer including a first input stage circuit, a first output stage circuit, a second output stage circuit, a first switching module, and a second switching module is disclosed. The first output stage circuit is coupled to a first data line. The second output stage circuit is coupled to a second data line. The first switching module is coupled between the first input stage circuit and the first output stage circuit. The second switching module is coupled between the first input stage circuit and the second output stage circuit.

18 Claims, 5 Drawing Sheets

OUTPUT BUFFER AND SOURCE DRIVER UTILIZING THE SAME

BACKGROUND OF THE INVENTION

1. Field of the Invention

The invention relates to an output buffer, and more particularly to an output buffer applied in a source driver.

2. Description of the Related Art

FIG. 1 is a schematic diagram of a conventional output buffer. The output buffer 100 comprises input stage circuits 111 and 113, output stage circuits 131 and 133, and an output multiplex unit 150. The output buffer 100 increases the driving capability of the input signals IN1 and IN2 to successfully drive the load units L1 and L2. However, the transistor sizes of the output stage circuit 131 and 133 and the output multiplex unit 150 are increased as a result. Thus, the size of the output buffer is increased.

In addition, when the output signals of the output stage circuit 131 and 133 approach a target, the voltage difference between the drain and the source of the transistor of the output multiplex unit 150 approaches 0V. If the load units L1 and L2 become heavier, when the output signals of the output stage circuits 131 and 133 approach the target, the driving speed of the output is reduced.

BRIEF SUMMARY OF THE INVENTION

Output buffers are provided. An exemplary embodiment of an output buffer comprises a first input stage circuit, a first output stage circuit, a second output stage circuit, a first switching module, and a second switching module. The first output stage circuit is coupled to a first data line. The second output stage circuit is coupled to a second data line. The first switching module is coupled between the first input stage circuit and the first output stage circuit. The second switching module is coupled between the first input stage circuit and the second output stage circuit.

Source drivers are also provided. An exemplary embodiment of a source driver comprises a digital-to-analog converter and an output buffer. The digital-to-analog converter generates a first analog signal and a second analog signal. The output buffer comprises a first input stage circuit, a first output stage circuit, a second output stage circuit, a first switching module, and a second switching module. The first input stage circuit receives the first analog signal. The first output stage circuit is coupled to a first data line. The second output stage circuit is coupled to a second data line. The first switching module is coupled between the first input stage circuit and the first output stage circuit. The second switching module is coupled between the first input stage circuit and the second output stage circuit.

Another exemplary embodiment of a source driver comprises a digital-to-analog converter and an output buffer. The digital-to-analog converter generates a first analog signal and a second analog signal. The output buffer comprises a first input stage circuit, a first output stage circuit, a second output stage circuit, a first switching module, a second switching module, a second input stage circuit, a third output stage circuit, a fourth output stage circuit, a third switching module, and a fourth switching module. The first input stage circuit receives the first analog signal. The first output stage circuit is coupled to a first data line. The second output stage circuit is coupled to a second data line. The first switching module is coupled between the first input stage circuit and the first output stage circuit. The second switching module is coupled between the first input stage circuit and the second output stage circuit. The second input stage circuit receives the second analog signal. The third output stage circuit is coupled to the second data line. The fourth output stage circuit is coupled to the first data line. The third switching module is coupled between the second input stage circuit and the third output stage circuit. The fourth switching module is coupled between the second input stage circuit and the fourth output stage circuit.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
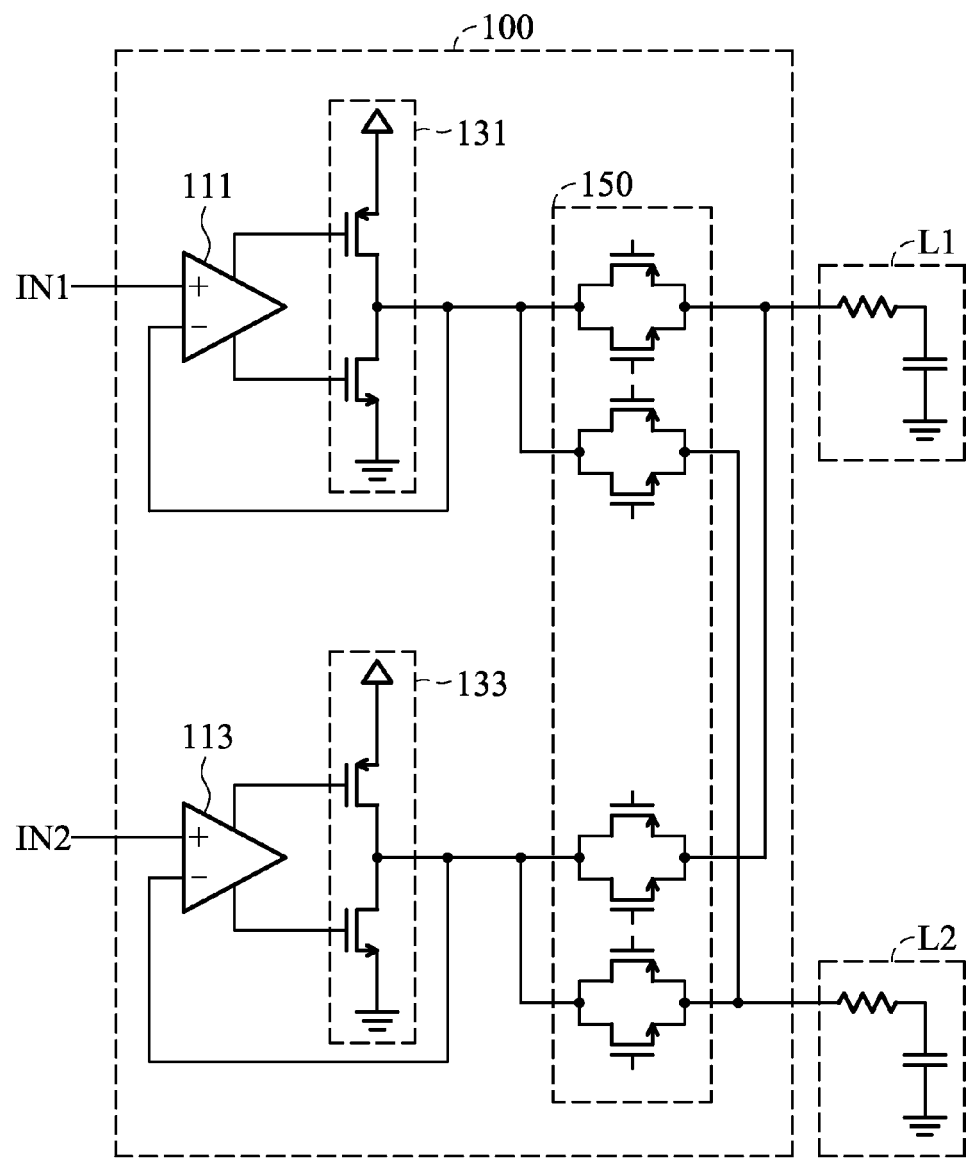
FIG. 1 is a schematic diagram of a conventional output buffer.
Figure 2:
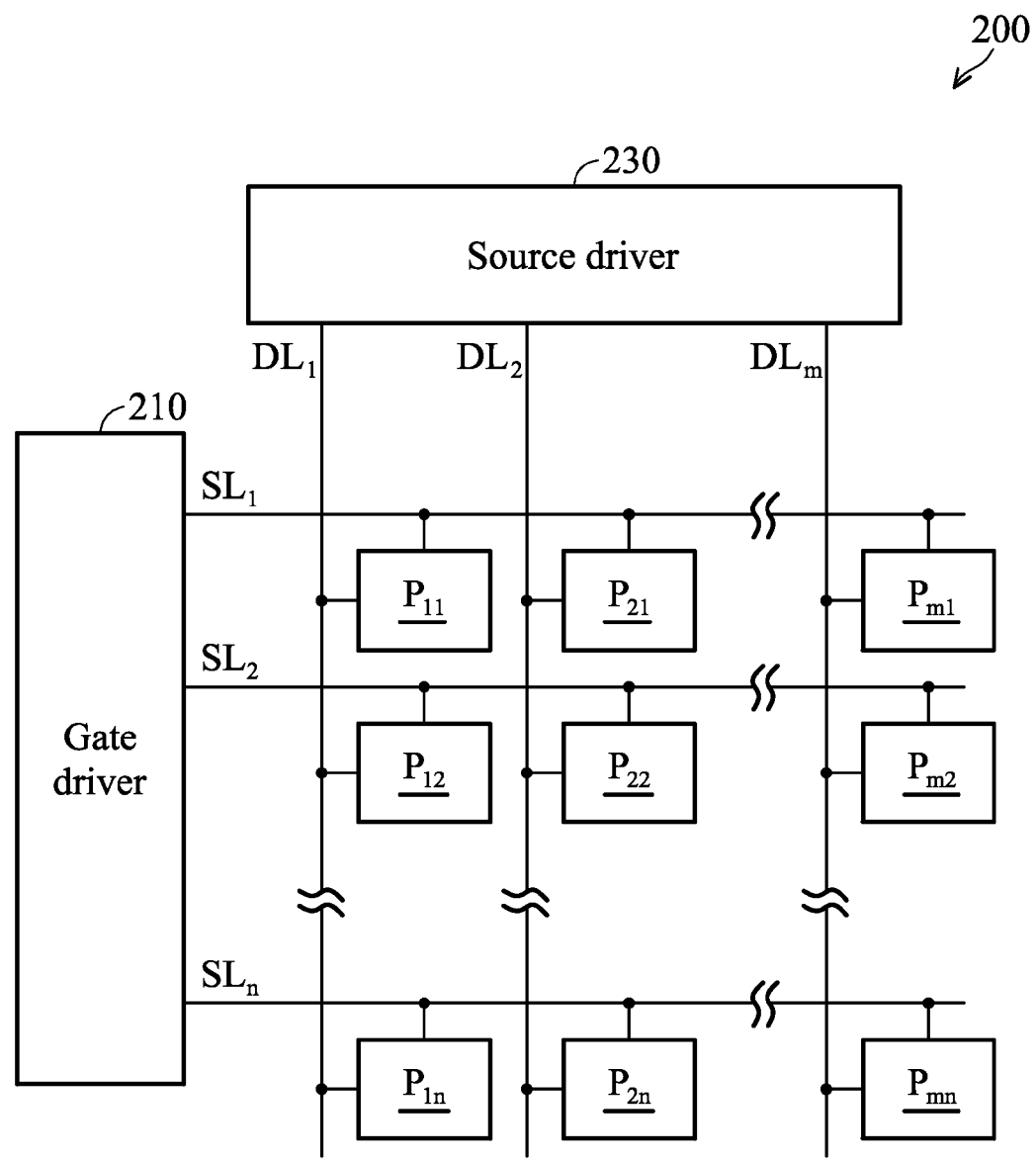
FIG. 2 is a schematic diagram of an exemplary embodiment of a display device.

FIG. 2 is a schematic diagram of an exemplary embodiment of a display device. The display device 200 comprises a gate driver 210, a source driver 230, and pixels $P_{11}$~$P_{mn}$. The gate driver 210 provides scan signals to the pixels $P_{11}$~$P_{mn}$ via the scan lines $SL_1$~$SL_n$. The source driver 230 provides data signals to the pixels $P_{11}$~$P_{mn}$ via the data lines $DL_1$~$DL_m$. The pixels $P_{11}$~$P_{mn}$ receive the data signals according to the scan signals and display brightness according to the data signals.

Figure 3A:
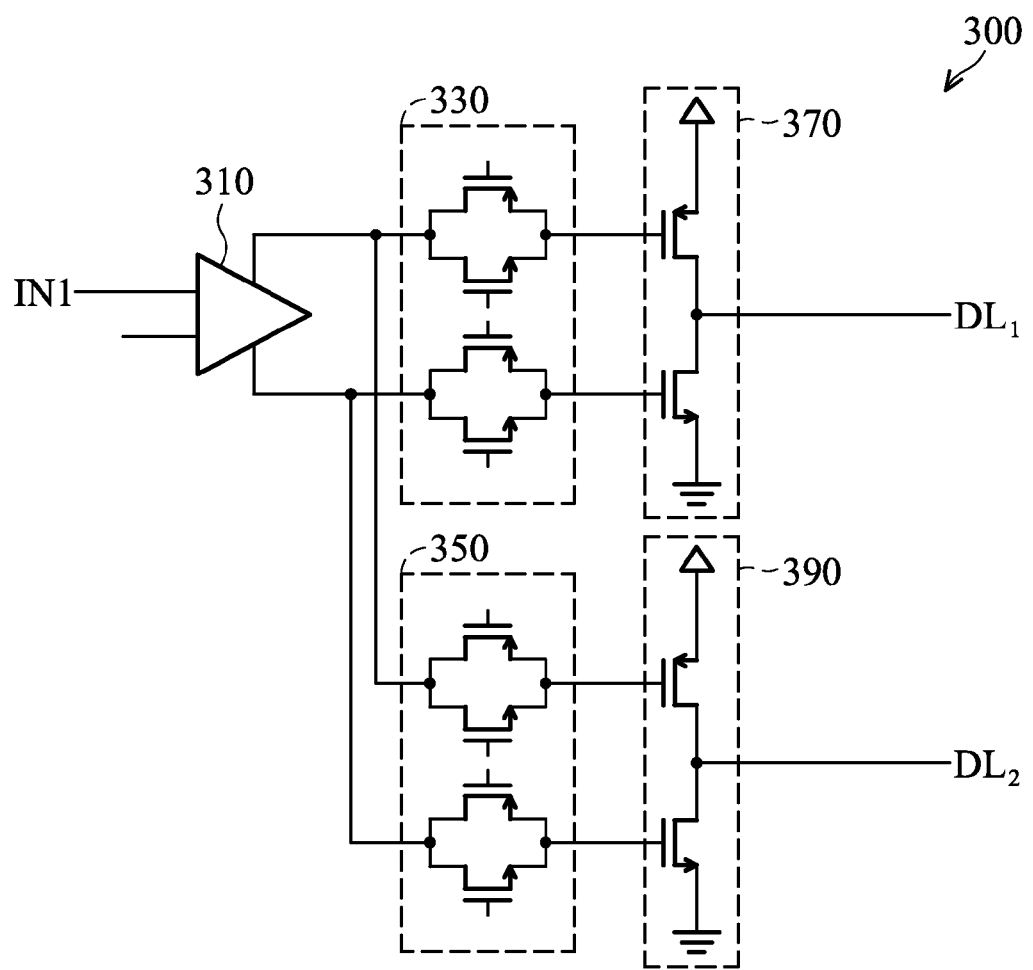
FIG. 3A is a schematic diagram of an exemplary embodiment of an output buffer.

To drive the pixels $P_{11}$~$P_{mn}$, the source driver 230 comprises an output buffer. FIG. 3A is a schematic diagram of an exemplary embodiment of an output buffer. The output buffer 300 as shown in FIG. 3 is capable of driving the pixels of two data line. The data lines $DL_1$ and $DL_2$ are given as an example.

As shown in FIG. 3A, the output buffer 300 comprises an input stage circuit 310, switching modules 330 and 350, and output stage circuits 370 and 390. The input stage circuit 310 receives an input signal IN1. The switching module 330 is coupled between the input stage circuit 310 and the output stage circuit 370. The output stage circuit 370 is coupled to the data line $DL_1$. The switching module 350 is coupled between the input stage circuit 310 and the output stage circuit 390. The output stage circuit 390 is coupled to the data line $DL_2$.

When the switching module 330 transmits the input signal IN1 to the output stage circuit 370, the output stage circuit 370 generates a first data signal to the data line $DL_1$ according to the input signal IN1. When the switching module 350 transmits the input signal IN1 to the output stage circuit 390, the output stage circuit 390 generates a second data signal to the data line $DL_2$ according to the input signal IN1. In this embodiment, when the switching module 330 transmits the input signal IN1, the switching module 350 stops transmitting the input signal IN1. When the switching module 350 transmits the input signal IN1, the switching module 330 stops transmitting the input signal IN1.

In FIG. 3A, the structures of the switching modules 330 and 350 are provided as an example. The switching modules 330 and 350 respectively transmit the input signal to the output stage circuits 370 and 390. Thus, the switching modules 330 and 350 can be replaced by other transmitting circuits or switches in other embodiments.

Similarly, the structures of the output stage circuits 370 and 390 are provided as an example. The output stage circuits 370 and 390 generate data signals to the data lines $DL_1$ and $DL_2$ respectively. Thus, the output stage circuits 370 and 390 as shown in FIG. 3A can be replaced by other circuits in other embodiments.

Figure 3B:
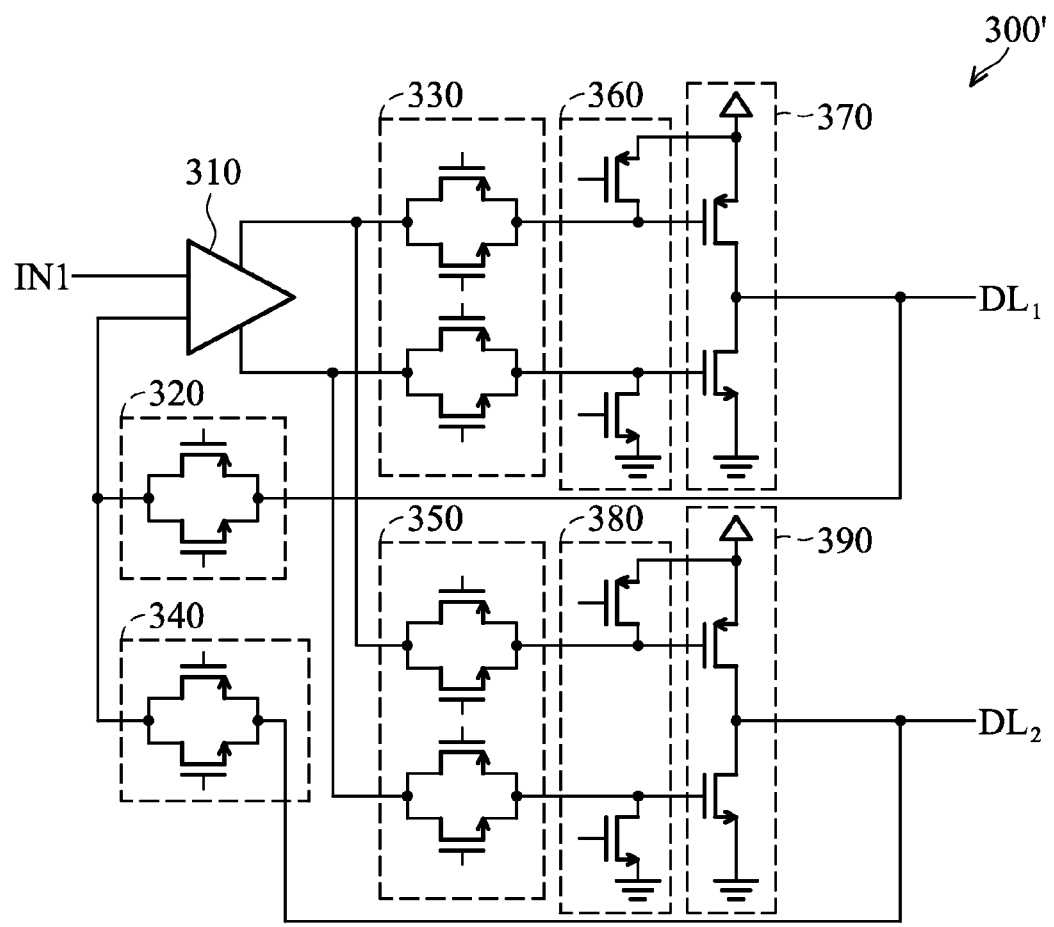
FIG. 3B is a schematic diagram of another exemplary embodiment of the output buffer.

FIG. 3B is a schematic diagram of another exemplary embodiment of the output buffer. FIG. 3B is similar to FIG. 3A except for the additions of the feedback modules 320 and 340 and the control modules 360 and 380. In some embodiment, the feedback modules 320 and 340 and/or the control modules 360 and 380 can be omitted.

The feedback module 320 provides the first data signal generated by the output stage circuit 370 to the input stage circuit 310. The feedback module 340 provides the second data signal generated by the output stage circuit 390 to the input stage circuit 310. In this embodiment, the input stage circuit 310 does not receive the first and the second data signals simultaneously.

In this embodiment, the control modules 360 and 380 control the output stage circuits 370 and 390 respectively. When the switching module 330 transmits the input signal IN1 to the output stage circuit 370, the control module 360 activates the output stage circuit 370 and the control module 380 de-activates the output stage circuit 390. Thus, the first data signal is generated by the output stage circuit 370. At this time, the feedback module 320 transmits the first data signal to the input stage circuit 310.

When the switching module 350 transmits the input signal IN1 to the output stage circuit 390, the control module 380 activates the output stage circuit 390 and the control module 360 de-activates the output stage circuit 370. Thus, the second data signal is generated by the output stage circuit 390. At this time, the feedback module 340 transmits the second data signal to the input stage circuit 310.

Figure 4:
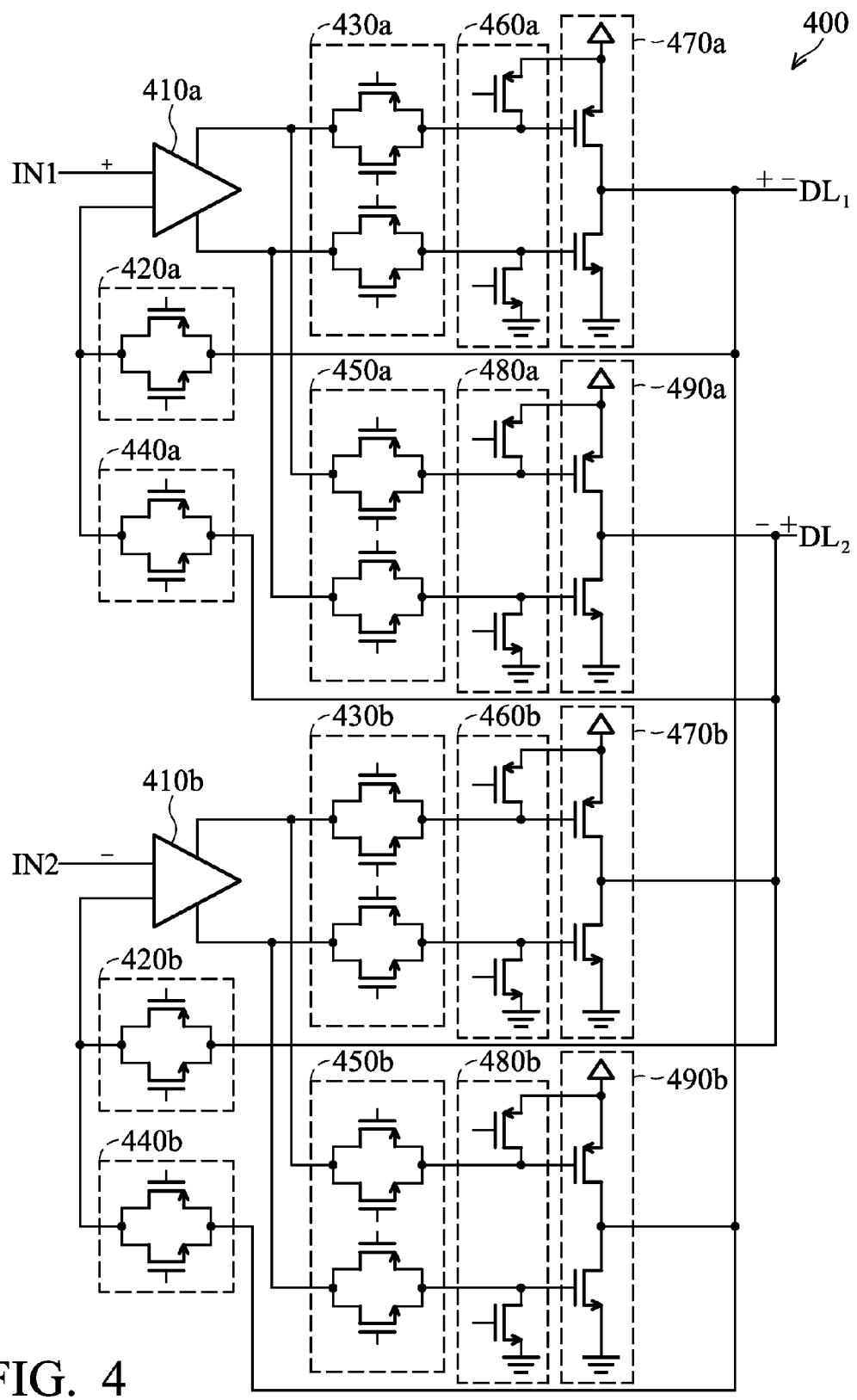
FIG. 4 is a schematic diagram of another exemplary embodiment of the output buffer.

FIG. 4 is a schematic diagram of another exemplary embodiment of the output buffer. FIG. 4 is similar to FIG. 3B except for the additions of an input stage circuit 410b, feedback modules 420b and 440b, switching modules 430b and 450b, control modules 460b and 480b, and output stage circuits 470b and 490b. The input stage circuit 410b, the feedback modules 420b and 440b, the switching modules 430b and 450b, the control modules 460b and 480b, and the output stage circuits 470b and 490b are the same as the input stage circuit 310, the feedback modules 320 and 340, the switching modules 330 and 350, the control modules 360 and 380, and the output stage circuits 370 and 390 as shown in FIG. 3B.

The input circuits 410a and 410b respectively receive the input signals IN1 and IN2. The input signals IN1 and IN2 may be differential signals. In one embodiment, the input signals IN1 and IN2 are generated by a digital-to-analog converter (DAC), such as a resistor-string DAC.

Assuming that the input signal IN1 is positive and the input signal IN2 is negative, when the switching module 430a transmits the input signal IN1 to the output stage circuit 470a, the data signal generated by the output stage circuit 470a is positive. When the switching module 450b transmits the input signal IN2 to the output stage circuit 490b, the data signal generated by the output stage circuit 490b is negative. Similarly, when the switching module 450a transmits the input signal IN1 to the output stage circuit 490a, the data signal generated by the output stage circuit 490a is positive. When the switching module 430b transmits the input signal IN2 to the output stage circuit 470b, the data signal generated by the output stage circuit 470b is negative. Thus, the polarity of the data signal is controlled by the switching modules 430a, 450a, 430b, and 450b.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An output buffer, comprising:
   a first input stage circuit;
   a first output stage circuit connected to a first data line, wherein the first data line is connected to a plurality of first pixels on a first column, the first output stage circuit generates a first data signal to the plurality of first pixels, and the plurality of first pixels display brightness according to the first data signal;
   a second output stage circuit connected to a second data line, wherein the second data line is connected to a plurality of second pixels on a second column, the second output stage circuit generates a second data signal to the plurality of second pixels, and the plurality of second pixels display brightness according to the second data signal;
   a first switching module coupled between the first input stage circuit and the first output stage circuit; and
   a second switching module coupled between the first input stage circuit and the second output stage circuit,
   wherein when the plurality of first pixels receive the first data signal, the plurality of second pixels does not receive the first data signal, and when the plurality of second pixels receive the second data signal, the plurality of first pixels does not receive the second data signal.

2. The output buffer as claimed in claim 1, wherein the first input stage circuit receives a first input signal, and when the first switching module transmits the first input signal to the first output stage circuit, the first output stage circuit generates the first data signal to the first data line according to the first input signal, and when the second switching module transmits the first input signal to the second output stage circuit, the second output stage circuit generates the second data signal to the second data line according to the first input signal.

3. The output buffer as claimed in claim 2, further comprising:
   a first feedback module transmitting the first data signal to the first input stage circuit; and
   a second feedback module transmitting the second data signal to the first input stage circuit.

4. The output buffer as claimed in claim 2, further comprising:
   a first control module controlling the first output stage circuit; and
   a second control module controlling the second output stage circuit, wherein when the first switching module transmits the first input signal to the first output stage circuit, the first control module activates the first output stage circuit and the second control module de-activates the second output stage circuit, and when the second switching module transmits the first input signal to the second output stage circuit, the first control module de-activates the first output stage circuit and the second control module activates the second output stage circuit.

5. The output buffer as claimed in claim 2, further comprising:
a second input stage circuit;
a third output stage circuit connected to the second data line;
a fourth output stage circuit connected to the first data line;
a third switching module coupled between the second input stage circuit and the third output stage circuit; and
a fourth switching module coupled between the second input stage circuit and the fourth output stage circuit.

6. The output buffer as claimed in claim 5, wherein the second input stage circuit receives a second input signal, and when the fourth switching module transmits the second input signal to the fourth output stage circuit, the fourth output stage circuit generates a third data signal to the first data line according to the second input signal, and when the third switching module transmits the second input signal to the third output stage circuit, the third output stage circuit generates a fourth data signal to the second data line according to the second input signal.

7. The output buffer as claimed in claim 6, wherein the first and the fourth data signals are positive, and the second and the third data signals are negative.

8. A source driver, comprising:
a digital-to-analog converter generating a first analog signal and a second analog signal; and
an output buffer comprising:
a first input stage circuit receiving the first analog signal;
a first output stage circuit connected to a first data line, wherein the first data line is connected to a plurality of first pixels on a first column, the first output stage circuit generates a first data signal to the plurality of first pixels, and the plurality of first pixels display brightness according to the first data signal;
a second output stage circuit connected to a second data line, wherein the second data line is connected to a plurality of second pixels on a second column, the second output stage circuit generates a second data signal to the plurality of second pixels, and the plurality of second pixels display brightness according to the second data signal;
a first switching module coupled between the first input stage circuit and the first output stage circuit; and
a second switching module coupled between the first input stage circuit and the second output stage circuit, wherein when the plurality of first pixels receive the first data signal, the plurality of second pixels does not receive the first data signal, and when the plurality of second pixels receive the second data signal, the plurality of first pixels does not receive the second data signal.

9. The source driver as claimed in claim 8, wherein when the first switching module transmits the first analog signal to the first output stage circuit, the first output stage circuit generates the first data signal to the first data line according to the first analog signal, and when the second switching module transmits the first analog signal to the second output stage circuit, the second output stage circuit generates the second data signal to the second data line according to the first analog signal.

10. The source driver as claimed in claim 9, further comprising:

a first feedback module transmitting the first data signal to the first input stage circuit; and
a second feedback module transmitting the second data signal to the first input stage circuit.

11. The source driver as claimed in claim 9, further comprising:
a first control module controlling the first output stage circuit; and
a second control module controlling the second output stage circuit, wherein when the first switching module transmits the first analog signal to the first output stage circuit, the first control module activates the first output stage circuit and the second control module de-activates the second output stage circuit, and when the second switching module transmits the first analog signal to the second output stage circuit, the first control module de-activates the first output stage circuit and the second control module activates the second output stage circuit.

12. The source driver as claimed in claim 9, further comprising:
a second input stage circuit receiving the second analog signal;
a third output stage circuit connected to the second data line;
a fourth output stage circuit connected to the first data line;
a third switching module coupled between the second input stage circuit and the third output stage circuit; and
a fourth switching module coupled between the second input stage circuit and the fourth output stage circuit.

13. The source driver as claimed in claim 12, wherein when the fourth switching module transmits the second analog signal to the fourth output stage circuit, the fourth output stage circuit generates a third data signal to the first data line according to the second analog signal, and when the third switching module transmits the second analog signal to the third output stage circuit, the third output stage circuit generates a fourth data signal to the second data line according to the second analog signal.

14. The source driver as claimed in claim 13, wherein the first and the fourth data signals are positive, and the second and the third data signals are negative.

15. A source driver, comprising:
a digital-to-analog converter generating a first analog signal and a second analog signal; and
an output buffer comprising:
a first input stage circuit receiving the first analog signal;
a first output stage circuit connected to a first data line, wherein the first data line is connected to a plurality of first pixels on a first column, the first output stage circuit generates a first data signal to the plurality of first pixels, and the plurality of first pixels display brightness according to the first data signal;
a second output stage circuit connected to a second data line, wherein the second data line is connected to a plurality of second pixels on a second column, the second output stage circuit generates a second data signal to the plurality of second pixels, and the plurality of second pixels display brightness according to the second data signal;
a first switching module coupled between the first input stage circuit and the first output stage circuit;
a second switching module coupled between the first input stage circuit and the second output stage circuit;
a second input stage circuit receiving the second analog signal;
a third output stage circuit connected to the second data line;

a fourth output stage circuit connected to the first data line;

a third switching module coupled between the second input stage circuit and the third output stage circuit; and a fourth switching module coupled between the second input stage circuit and the fourth output stage circuit, wherein when the plurality of first pixels receive the first data signal, the plurality of second pixels does not receive the first data signal, and when the plurality of second pixels receive the second data signal, the plurality of first pixels does not receive the second data signal.

16. The source driver as claimed in claim 15, further comprising:

a first feedback module coupled between the first data line and the first input stage circuit;

a second feedback module coupled between the second data line and the first input stage circuit;

a third feedback module coupled between the second data line and the second input stage circuit;

a fourth feedback module coupled between the first data line and the second input stage circuit.

17. The source driver as claimed in claim 15, further comprising:

a first control module controlling the first output stage circuit;

a second control module controlling the second output stage circuit;

a third control module controlling the third output stage circuit;

a fourth control module controlling the fourth output stage circuit.

18. The source driver as claimed in claim 15, wherein the digital-to-analog converter is a resistor-string digital-to-analog converter.

* * * * *